(12) United States Patent
Bell et al.

(10) Patent No.: US 8,314,874 B2
(45) Date of Patent: *Nov. 20, 2012

(54) CCD IMAGING ARRAY WITH EXTENDED DYNAMIC RANGE

(75) Inventors: Raymond Thomas Bell, Middlesex (GB); Roger John Pittock, Essex (GB)

(73) Assignee: E2V Technologies (UK) Limited, Chelmsford, Essex (GB)

( * ) Notice: Subject to any disclaimer, the term of this patent is extended or adjusted under 35 U.S.C. 154(b) by 322 days.

This patent is subject to a terminal disclaimer.

(21) Appl. No.: 12/726,050

(22) Filed: Mar. 17, 2010

(65) Prior Publication Data

US 2010/0245640 A1 Sep. 30, 2010

(30) Foreign Application Priority Data

Mar. 17, 2009 (GB) .................................. 0904549.3

(51) Int. Cl.
*H04N 5/335* (2006.01)
(52) U.S. Cl. ....................................... 348/311; 348/315
(58) Field of Classification Search .................. 348/312, 348/314, 315
See application file for complete search history.

(56) References Cited

U.S. PATENT DOCUMENTS

| | | | |
|---|---|---|---|
| 4,302,779 A | | 11/1981 | Inoue |
| 4,450,484 A | * | 5/1984 | Terakawa et al. ............. 348/249 |
| 4,878,102 A | * | 10/1989 | Bakker et al. ................. 257/215 |
| 5,276,520 A | | 1/1994 | Hawkins et al. |
| 5,517,244 A | * | 5/1996 | Stekelenburg et al. ........ 348/305 |
| 6,444,968 B1 | | 9/2002 | Burt et al. |

* cited by examiner

*Primary Examiner* — Tuan Ho
(74) *Attorney, Agent, or Firm* — Venable LLP; Robert Kinberg

(57) ABSTRACT

A CCD such as a frame transfer CCD has an extended dynamic range. The image built up in the image region 1 in each integration period is transferred to the store region 2 in each frame transfer period, for example, at a TV signal rate. The dynamic range is increased by dividing the integration period into two parts, and clipping the signal in the first part, but not in the second. The signal is clipped by pulsing the clock electrodes of the image region so as to combine the charges from adjacent wells together, overspill being drained into the anti-blooming structure, consequently reducing well capacity.

18 Claims, 4 Drawing Sheets

CCD IMAGING ARRAY WITH EXTENDED DYNAMIC RANGE

CROSS-REFERENCE TO RELATED APPLICATIONS

This application claims priority to GB 0904549.3 filed in the United Kingdom on Mar. 17, 2009, the disclosure of which is incorporated herein by reference in its entirety.

BACKGROUND OF THE INVENTION

This invention relates to CCD imaging arrays.

The invention is particularly applicable to two-phase clocked CCDs, for example, of the frame transfer type or the full frame type. The invention is concerned with extending the dynamic range of such CCDs.

Referring to FIG. 1, which is a schematic view of a frame transfer CCD, charge is collected in an image region 1 consisting of a rectangular array of pixels, and then fed to a store region 2 also having a rectangular array of pixels. The integration takes place in the image section for one field period, typically just under $1/50^{th}$ second in the UK and typically just under $1/60^{th}$ second in the US. The image is then transferred rapidly from the image section to the store section, line by line, but during a substantially shorter period, known as the frame transfer period. This is done by applying clocked voltages typically designated IØ1 and IØ2 to pairs of electrodes in the image region and clocked voltages SØ1 and SØ2 to pairs of electrodes in the store region. Then, while the next image is being built up on the image section, the image in the store section is clocked out line-by-line into an output register 3. Successive lines are clocked along the output register in serial fashion, and charge multiplication may take place in a multiplication register 4 connected as a linear extension to the output register, such as, for example described in our U.S. Pat. No. 6,444,968.

Optionally, and ideally, a shutter disperses or, better, blanks off the optical signal to the CCD during the frame transfer period to prevent frame shift smear. This may be achieved in practice with a liquid crystal arrangement such as a liquid crystal polymer (LCP) shutter, or a mechanical arrangement such as a rotating disc with a blade to obscure the CCD.

Typically an anti-blooming drain is provided whose potential is set so as to trap and discharge any build-up of signal within any pixel or group of pixels that would otherwise spill over into adjacent pixels and give blooming to the image in that area. This provides an artificial white clip. The smallest useable signal is a finite measure which exceeds the noise floor of the readout system. The ratio of the clipped white value to the useable low level is known as the dynamic range of the sensor, and is often expressed in terms of "stops", dB or octaves.

The operation of the anti-blooming drain will now be described with reference to FIGS. 2 to 6. FIG. 2 shows a fragment 5 of the image region 1 of the frame transfer CCD of FIG. 1 on an enlarged scale, FIG. 3 is a section taken on the lines 3-3 in FIG. 2, and FIGS. 4 to 6 show the potential under the electrodes shown in FIG. 3 in various operating states, with potential increasing in the negative direction as seen in the drawing.

FIG. 2 shows a fragment of a column of pixels p1 to p3. Laterally, the pixels are defined by isolation regions which incorporate anti-blooming structures. The anti-blooming structures comprise of drains 8, 9 with barrier regions 6, 7, 10, 11 on either side. The drains are joined to a common connection, typically at the 'top' of the image section (remote from the storage section), and supplied by a suitable voltage source or clock pulse generator. The drains are typically produced by a relatively high dose ion implantation to give high conductivity which permits them to absorb large quantities of excess signal charge. The barriers 6, 7, 10, 11 on either side of the drains may be formed by a relatively low dose ion implantation, by an additional gate electrode which underlies the CCD transfer clock electrodes, or by a combination of the two. The barriers on opposite sides of a drain may be different in type and in 'height' such that only those on one side of the drain are active in the anti-blooming process. If gate electrodes are used they are also typically joined at the 'top' of the image section and supplied by a suitable voltage source or clock pulse generator. To minimise the fraction of the device active area occupied by the drain structure, symmetrical drains may be incorporated between alternate pairs of columns, with conventional channel stop regions between the other pairs, such that each column is adjacent to one drain and one channel stop.

The pixels p1, p3 and p5 are in rows (or lines) in the store region, and correspond to Display lines 1, 3 and 5 in FIG. 5. Each row of pixels is associated with a pair of electrodes, for example, e1, e2.

Under each electrode e1 to e6, there is a respective doped implant region d1 to d6, which regions are essential to enable the CCD to operate in a two-phase manner. The implant regions define regions of low potential which separate potential wells w1 to w6 and enable charge to be built up (in two wells) for each individual pixel. Alternative techniques to produce the regions of low potential (e.g. variations in dielectric thickness) are also known and may be used with this invention.

In the standard operating mode, photo-generated charge is collected in the image section of the CCD during the integration periods with both clock phases Ø1 and Ø2 held in their low state (FIG. 4), so that the potential of the wells w1 to w6 is low (but not as low as that under the implants d1 to d6). Charge accumulates in the wells (FIG. 4). This low state is typically at a potential sufficiently negative with respect to the CCD substrate that the silicon surface in the CCD buried channel becomes inverted and a layer of holes 'pins' the surface potential to the substrate bias voltage. The presence of these holes at the surface significantly reduces dark current generation by 'surface states' at the interface between the silicon and the silicon dioxide gate dielectric. This is a well-known technique described as pinned, multi phase pinned (MPP) or inverted mode operation (IMO).

The anti-blooming drains 8, 9 absorb photo-generated charge signals which exceed a designated storage capacity of the wells w1 to w6. This prevents such charge packets spreading beyond their regions of generation and corrupting adjacent parts of the image. The anti-blooming structures include barriers 6, 7 which define the signal level at which charge spills to the anti-blooming structure. Hence, during the integration period, charge cannot build up beyond a designated level in the wells w1 to w6 (FIG. 4), as excess charge drains over the barriers 6, 7 to the anti-blooming structure.

During the subsequent frame transfer period, the voltages Ø1, Ø2 applied to the electrodes e1 to e6 are alternately pulsed high. Referring to FIG. 5, on the first cycle, the voltages Ø2 on electrodes e1, e3, e5 are pulsed high, while the voltages Ø1 on electrodes e2, e4, e6 are pulsed low, and this results in the charge in pairs of wells w1, w2; w3, w4; and w5, w6 being combined to form Display lines 1, 3, 5 respectively. On the next clock cycle, voltages Ø1 are pulsed high while voltages Ø2 are pulsed low, which transfers the combined charges to the well to the right as seen in FIG. 5, for example, the charge stored beneath electrode e5 is transferred to below e4, the charge beneath e3 is transferred to below e2, etc. Ø1 and Ø2 in both image and store section are together clocked high alternately until the entire charge pattern from the image section has been transferred to the store section.

CCDs for TV imaging need to produce two interlaced fields to produce one frame, and the required interlace operation is achieved by different pairing of the charge collected under adjacent electrodes in the odd and even fields. This is achieved by taking a different one of the voltages, Ø1 and Ø2 high at the start of alternate frame transfer operations. Comparing FIG. 6 with FIG. 5, it can be seen the charge in pairs of wells w2 and w3 is combined to produce Display line 2, and the charge in pairs of wells w4 and w5 is combined to produce Display line 4.

One known technique for enhancing the dynamic range involves modifying the storage capacity of the image section during the integration period by modulating the potentials applied to the anti-blooming drain or gate (U.S. Pat. No. 5,276,520). Referring to FIG. 7, during a first portion (90%, for example) of the integration period the storage capacity of the CCD image section is reduced to a level (50% for example) below its normal capacity by effectively lowering the barrier between the storage site and the anti-blooming drain. During the second portion (10%) of the integration period the full storage capacity (100%) is restored. The relationship between these values is determined by the timing and amplitude of the voltage modulation applied to the anti-blooming structure. The advantage of this can be seen by reference to FIG. 7.

If there were no clipping, and signal levels I1 and I2 were received, both would reach the capacity of the well within the integration period, and the CCD could not detect any difference in the intensity of the incoming signals. By clipping the signal for a part of the integration period, the CCD is able to distinguish between very high illumination (dashed line) I1, high illumination (chain dashed line) I2, medium illumination (dotted) I3, and low illumination (solid line) I4.

However, there are two disadvantages with this known technique. Firstly, the method requires additional drive waveforms to be applied to the anti-blooming structure. The voltages required for these waveforms are generally different to the standard clock levels and the required stability may be higher than normally required for a clock pulse in order to maintain a consistent transfer function. Secondly, it is known that, in many cases, when the capacity of a pixel is reduced by modulating an anti-blooming structure, the uniformity of the clipping level exceeds an acceptable margin. Such non-uniformity would add additional noise to all signal levels which were clipped for any part of the integration period.

Another technique for increasing the dynamic range in an interline transfer CCD has been proposed (U.S. Pat. No. 4,302,779). Excess signal charge in the individual photosensitive elements is drained as a non-information signal using pulse signals of carefully controlled amplitude.

SUMMARY

The invention provides a CCD having an image region comprising an array of pixels, a pair of electrodes being associated with each pixel which can be clocked to enable two-phase charge transfer to take place, an anti-blooming structure associated with the pixels, and electrode pulsing means for combining the charges collected under the pair of electrodes at each pixel under one only of the electrodes of each pair, at least once during each integration period.

The invention also provides a method of operating a CCD to produce extended dynamic range, the CCD having an image region comprising an array of pixels and an anti-blooming structure associated with the pixels, the method comprising clocking a pair of electrodes associated with each pixel to cause two-phase charge transfer to take place, including the step of pulsing the pair of electrodes at each pixel to combine the charges collected under one only of the electrodes of each pair, at least once during each integration period.

The storage capacity of the image region of the CCD of the invention thus can be reduced during a portion of the integration period using an anti-blooming structure and without any need for the anti-blooming structure to be specially modified.

The electrode pulsing means may combine the charges by raising and lowering the potential of one of the electrodes, while the other electrode is maintained low. In the case of video, the pulsing (both raising and lowering) should preferably be done within the line blanking interval, when signal readout is not taking place, to avoid breakthrough of the clock pulses onto the video signal. The line transfer of charge into the readout register from a store also occurs in the line blanking interval. These two operations may conveniently be simultaneous or either one may be performed before the other.

The combining of the charges could be carried at a plurality of line blanking intervals for a first part of the integration period. The electrodes are advantageously both held low during the remainder of the integration period, and this may correspond to the read-out of the last group of lines (for example, fewer than ten), or the read-out of the last line. Indeed, in the case where a shutter is provided to prevent frame shift smear, the holding of both electrodes low (without any pulsing) may correspond to less time than that taken to read-out the last line in the store.

BRIEF DESCRIPTION OF THE DRAWINGS

One way of carrying out the invention will now be described in detail, by way of example, with reference to the accompanying drawings, in which.

Like reference numerals have been given to like parts throughout all the drawings.

DETAILED DESCRIPTION

The invention will be described with reference to a frame transfer CCD constructed in the same way as the prior art frame transfer CCD described with reference to FIGS. 1 to 3 and 7 of the drawings, but with different clock voltages Ø1 and Ø2 applied to the electrodes e1 to e6 to achieve an increase in dynamic range.

Figure 1:
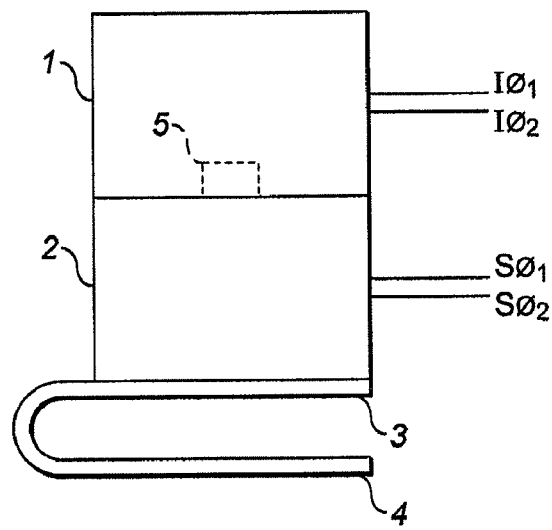
FIG. 1 is a schematic view of a prior art frame transfer CCD.
Figure 2:
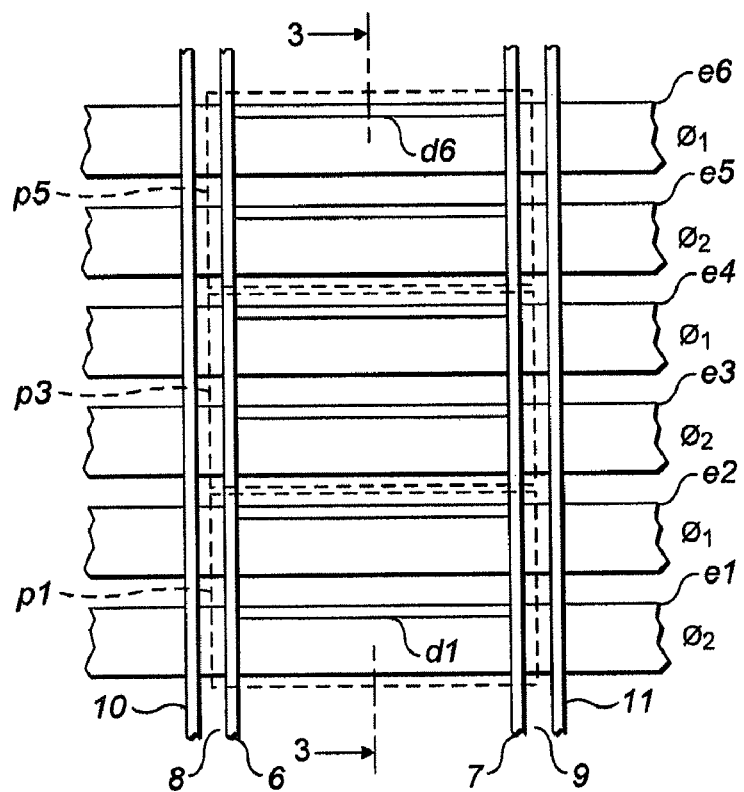
FIG. 2 shows a fragment 5 of the image region 1 of the frame transfer CCD of FIG. 1 on an enlarged scale.
Figure 3:
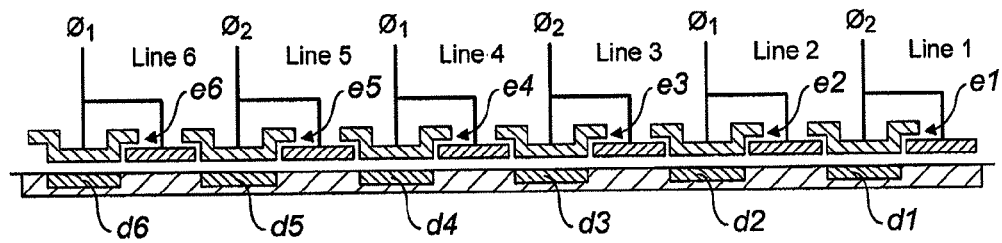
FIG. 3 is a section taken on the lines 3-3 in FIG. 2.
Figure 4:
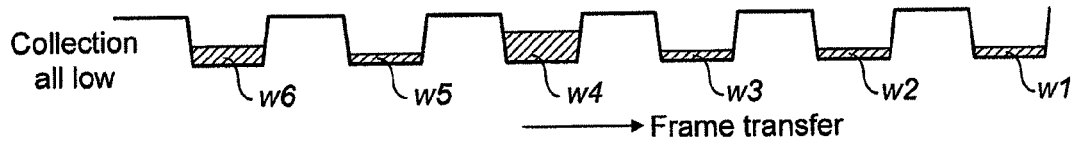
FIGS. 4 to 6 show the potential under the electrodes shown in FIG. 3 in various operating states, with potential increasing in the negative direction as seen in the drawing.
Figure 5:
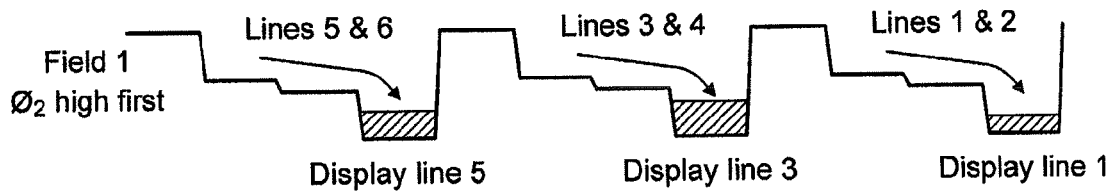
Figure 6:
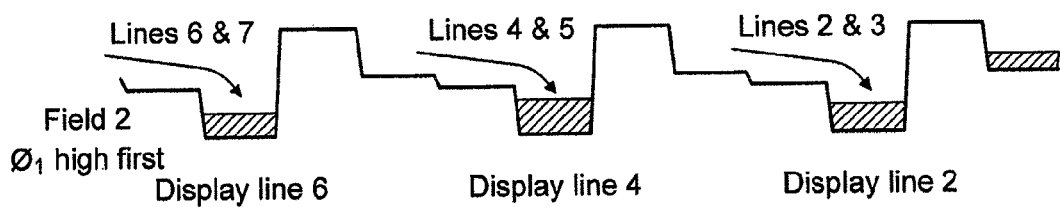
Figure 7:
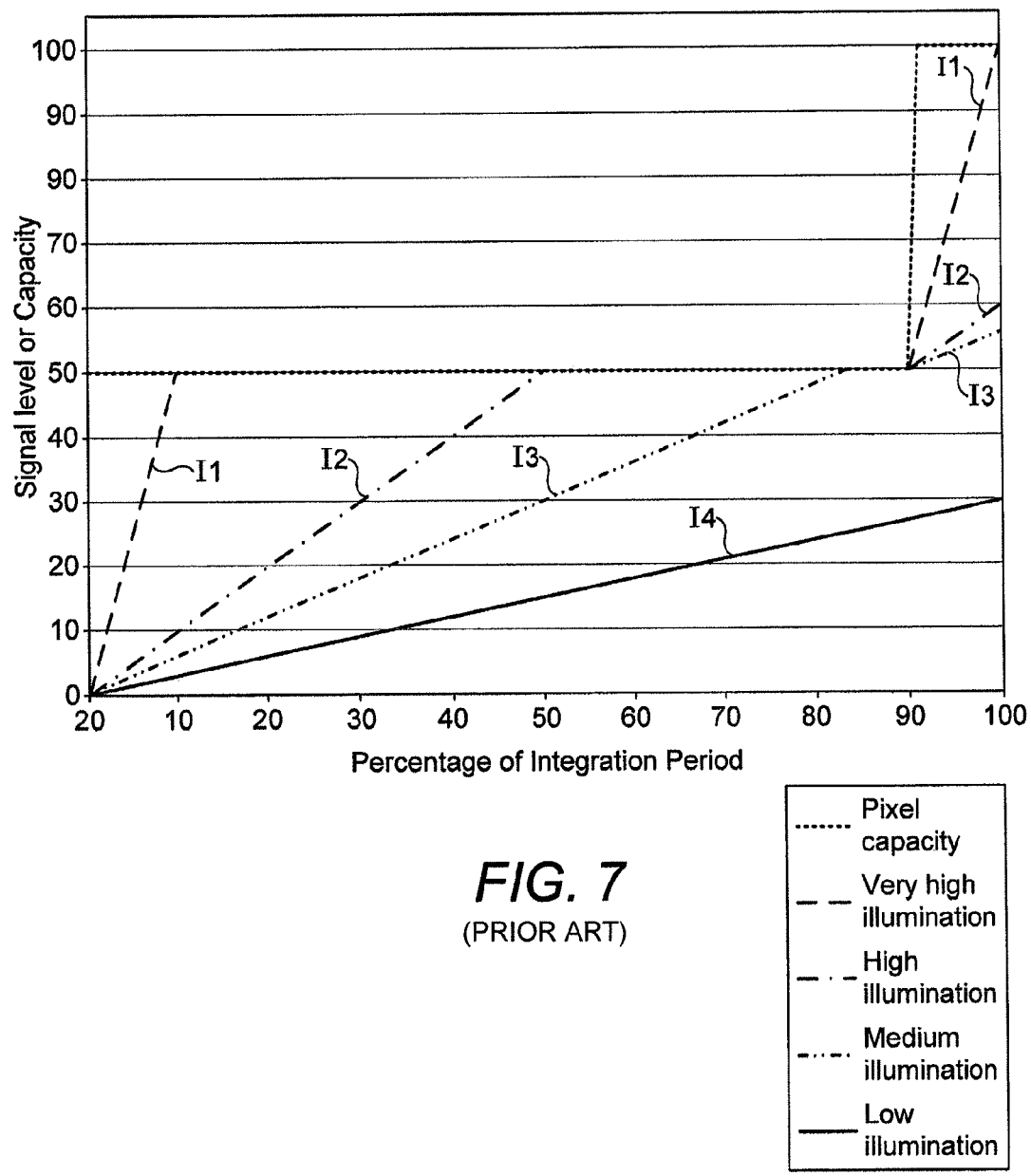
FIG. 7 shows the dynamic range of a CCD clipped during the integration period.
Figure 8:
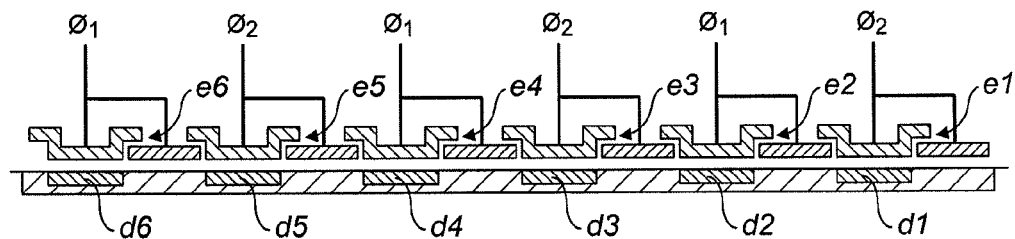
FIGS. 8 to 11 are views corresponding to FIGS. 3 to 6 for a frame transfer CCD in accordance with the invention.

During the first portion, for example, the first 90% as in FIG. 7, of an integration period (when a lower capacity is required), one of the image section clock pulses, say, Ø1, is periodically raised and then lowered while the other remains in its low state.

This pulsing of the image clock Ø1 may optionally be synchronised with the pulsing of the store clocks as they perform a line transfer. If so, both the line transfer and the raising and lowering clock pulses will occur within the line blanking interval. They may conveniently be synchronised exactly to simplify timing but it is not necessary for them to be.

Figure 9:
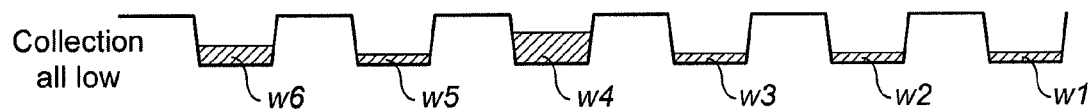
Figure 10:
Figure 11:

Referring to FIG. 9, the integration period starts with both clock pulses Ø1 and Ø2 held low, in order to achieve low dark noise associated with a pinned arrangement. At the end of the first line transfer of the image in the store, the voltage Ø2 in the first field integration is raised, so that the charge collected in adjacent wells is combined (FIG. 10). The well w5 now contains the charge from both wells w6 and w5, well w3 contains the charge collected in both wells w3 and w4, and well w1 contains the charge accumulated in both wells w1 and w2. Once this charge has been transferred, the voltage Ø2 is lowered, and collection resumes (FIG. 11). The procedure is repeated at the end of the second line, and throughout subsequent line transfers, for this first portion of the integration period.

The storage capacity for charge during the first portion of the integration period is therefore reduced to approximately half its maximum value, that is, to the capacity of a single low electrode rather than that of two low electrodes.

During this first portion of the integration period, when the capacity of the wells w5, w3 and w1 containing the combined charges is exceeded, charge exceeding the anti-blooming control threshold drains over the barriers 6, 7 into the anti-blooming structure 8, 9.

For the remaining portion, for example, 10% of the integration, the clock pulses Ø1 and Ø2 are held low as in the prior art.

The storage capacity with one electrode high during frame transfer and the capacity in the storage section must be arranged to be significantly larger than that of a single low electrode in the image section but this will generally be the case if the store section does not include an anti-blooming structure.

In this way, four levels of illumination I1 (very high), I2 (high), I3 (medium) and I4 (low), can all be distinguished, without the disadvantages entailed by modulating the potentials on the anti-blooming structure.

For the purposes of interlaced scan, for the integration corresponding to the second field of the frame, the Ø1 clocks are raised and lowered in the line blanking periods to combine the charges into wells w2, w4 and w6.

The proportion of the integration period for which the raising and lowering of the electrode voltages takes place need not be 90%, but could be any proportion of the integration period, for example 75%.

Indeed, it is not necessary for one of the electrode voltages to be repeatedly raised and lowered in each line blanking period (during the line blanking interval) during the first part of the integration period, it could be done less frequently, for example, once every other line blanking period. It is, however, necessary for the raising and lowering to be carried out at least once at the end of the first portion of the integration period.

Equally, if the repeated raising and lowering of the electrode voltage extends over substantially more than 75% of the integration time, build up of charge over and above this reduced clipping level will occur for the shorter integration time remaining. It follows that discrimination of more levels of signal can be resolved above the white level that would previously have resulted in a clipping action. In the limit, the raising and lowering can continue until the last line period, allowing uninhibited integration to occur over just the last line, period. This would extend the dynamic resolvable range by several stops. FIG. 7 illustrates an extension of dynamic range by a factor of 5.

The embodiment described uses only the standard amplitude image clocks but with pulses at additional times in the readout sequence.

Further, variations may be made to the clocking scheme described with reference to FIGS. 8 to 11. Thus, as an alternative to the arrangement described, wherein the potential of one electrode of each pair is raised and lowered during the line blanking interval in the read-out of the store region, instead, one electrode of each pair may be pulsed high for the active line read-out from the output register 3, returning low only during each line blanking. This dither clocking would give a greater depletion depth during the line read-out period, and there would only be a small degradation of dark current (since the electrode would not now be pinned) from the fully pinned case, as the dither clocking would be quite effective to suppress dark current for an operating temperature of around 0 degree centigrade.

While the invention has been described in relation to a frame transfer CCD, the invention is also applicable to other forms of CCD, such as full frame, TDI (time delay and integration) and linear arrays. The CCD may form the imaging element of a digital camera, and is especially suitable for video cameras.

The modification to the timing of the electrode pulses is very simple and can easily be added to typical programmable pulse sequencers such as programmable FPGA (field programmable gate arrays) used in CCD cameras to give a significant improvement in dynamic range with no hardware changes. Because the anti-blooming structure is operated at its normal level non-uniformity of its clipping point is minimised.

The technique described is restricted to a capacity ratio between the first and second integration periods of 1:2 and this restricts the flexibility of adjustment of the transfer function. However if desired the technique may be combined with the prior art technique of modulating the bias applied to the anti-blooming structure to obtain even greater flexibility.

Thus, for example, if the controlling electrode of the anti-blooming structure is brought to a level where a greater degree of overspill is encouraged during this portion of integration, the level of signal clipping will be reduced to something less than 50% of the uncapped level.

The fixed pattern element of the noise introduced at the clipping point knee may be removed during post processing. A look-up table of the level at which each pixel actually clips may be stored in the camera, and such levels can be balanced in an attempt to minimise the noise introduced at the break point.

The actual break point introduced in the level of the captured video field can be removed during post-processing. If a histogram processing stage is incorporated, this is already automatically achieved without additional processing. If histogram processing is not included or is switched out, a linea-rising transfer function could be applied to the signal. This can be achieved simply at camera set-up stage by storing the results of a linear optical ramp that extends from substantially below to substantially above the break point and its inverse function stored as a multiplicand.

A shutter may be deployed to counteract frame shift smear during the frame transfer period. Its transition characteristics, ordinarily of limited importance, will now dominate. For a shutter based on liquid crystal or similar, where transmissivity, reflectivity etc are substantially the same across the whole of the image area, any jitter or variability of speed of turn-off will affect the effective bright signal integration time to a correspondingly greater degree than before thanks to the latter now representing a comparable time to the former. A mechanical rotary device with a blade that obscures the light path during frame transfer is no longer compatible in its typical guise because of the effective integration of the signal no longer being symmetrical over the field period. For this reason, there may be used a shutter consisting of two blades, described and claimed in our concurrently filed and commonly owned U.S. patent application Ser. No. 12/726,046, the disclosure of which is incorporated herein by reference.

The invention claimed is:

1. A CCD having an image region comprising an array of pixels, a pair of electrodes being associated with each pixel which can be clocked to enable two-phase charge transfer to take place, an anti-blooming structure associated with the pixels, and electrode pulsing means for combining the charges collected under the pair of electrodes at each pixel under one only of the electrodes of each pair, at least once during each integration period.

2. A CCD as claimed in claim 1, in which the potentials of both electrodes of each pair are held low, in use, during a final portion of the integration.

3. A CCD as claimed in claim 1, including a store region connected to the image region, the store region including an output register.

4. A CCD as claimed in claim 3, in which the electrode pulsing means is arranged to combine the charges in the line blanking intervals, during which transfer of charge to the readout register also occurs.

5. A CCD as claimed in claim 4, in which the electrode pulsing means is arranged to combine the charges periodically during the first 90% of an integration period.

6. A CCD as claimed in claim 4, in which the electrode pulsing means is arranged to combine the charges periodically during the integration period until the last line period.

7. A CCD as claimed in claim 1, in which the electrode pulsing means is arranged to combine the charges by raising the potential of one only of the electrodes of each pair.

8. A CCD as claimed in claim 7, in which the raising of the potential is followed by a lowering of the potential.

9. A CCD as claimed in claim 1, including means to adjust a control electrode of the anti-blooming structure during the integration period.

10. A method of operating a CCD to produce extended dynamic range, the CCD having an image region comprising an array of pixels and an anti-blooming structure associated with the pixels, the method comprising clocking a pair of electrodes associated with each pixel to cause two-phase charge transfer to take place, including the step of pulsing the pair of electrodes at each pixel to combine the charges collected under one only of the electrodes of each pair, at least once during each integration period.

11. A method as claimed in claim 10, including the step of holding the potentials of both electrodes of each pair low, in use, during a final portion of the integration.

12. A method as claimed in claim 10, including a store region connected to the image region, the store region including an output register.

13. A method as claimed in claim 12, including the step of pulsing the electrodes to combine the charges in the line blanking intervals, during which transfer of charge to the readout register also occurs.

14. A method as claimed in claim 13, including the step of pulsing the electrodes periodically to combine the charges during the first 90% of an integration period.

15. A method as claimed in claim 13, including the step of pulsing the electrodes periodically to combine the charges during the integration period until the last line period.

16. A method as claimed in claim 10, in which the electrodes are pulsed to combine the charges by raising the potential of one only of the electrodes of each pair.

17. A method as claimed in claim 16, in which the raising of the potential is followed by a lowering of the potential.

18. A method as claimed in claim 10, including the step of adjusting a control electrode of the anti-blooming structure during the integration period.

* * * * *